United States Patent

Gatwood

[15] 3,665,222

[45] May 23, 1972

[54] SHORT DURATION HIGH CURRENT PULSE GENERATOR

[72] Inventor: Robert K. Gatwood, Churubusco, Ind.

[73] Assignee: International Telephone and Telegraph Corporation, Nutley, N.J.

[22] Filed: Nov. 13, 1970

[21] Appl. No.: 89,191

[52] U.S. Cl. ....................307/283, 307/246, 307/202, 307/302

[51] Int. Cl. ....................H03k 17/00

[58] Field of Search ....................307/246, 283, 302; 328/67

[56] References Cited

UNITED STATES PATENTS

| | | | |
|---|---|---|---|
| 3,268,822 | 8/1966 | Hickey | 328/67 |
| 3,141,981 | 7/1964 | Henebry | 328/67 X |
| 3,555,301 | 1/1971 | Hansen | 328/67 X |
| 3,018,384 | 1/1962 | Zrubek | 307/246 |

*Primary Examiner*—Donald D. Forrer
*Assistant Examiner*—B. P. Davis
*Attorney*—C. Cornell Remsen, Jr., Walter J. Baum, Paul W. H. Emminger, Charles L. Johnson, Jr., Philip M. Bolton, Isidore Togut, Edward Goldberg and Emnotti J. Lombardi, Jr.

[57] ABSTRACT

A pulse modulator includes a pair of avalanche breakdown transistors connected in series, a direct current source for maintaining the avalanche transistors in their quiescent states and a triggering means for applying a pulse to the avalanche transistors to switch them simultaneously from their quiescent states to their activated states to generate a high current short duration output pulse. The modulator further includes a charge storage circuit connected to the direct current source and diodes connected between the storage circuit and the avalanche transistors and poled such that the storage circuit charges during the quiescent states of the transistors and discharges the stored charge into the avalanche transistors for increasing the power output therefrom. A plurality of pairs of avalanche transistors, storage circuits, and diodes connected in a manner similar to that of the first pair may be provided in parallel therewith for further increasing the power output of the modulator.

11 Claims, 3 Drawing Figures

INVENTOR
ROBERT K. GATWOOD
BY Sang Ki Lee
ATTORNEY

INVENTOR
ROBERT K. GATWOOD
BY Sang Ki Lee
ATTORNEY

SHORT DURATION HIGH CURRENT PULSE GENERATOR

BACKGROUND OF THE INVENTION

1. Field of the Invention

This invention relates to a pulse generator and more particularly, to an improved short duration high current pulse generator.

2. Description of the Prior Art

A conventional high current short duration pulse generator includes an active element such as an avalanche transistor which is normally biased in a quiescent state. The transistor generates a short duration high current pulse when switched into an activated state in response to a triggering pulse. The generator often includes a storage capacitor in which electric charge is stored during the quiescent state of the active element and which discharges the stored charge into the active element to increase the power output from the active element.

It is a general characteristic of the aforementioned conventional generator that, if the amplitude of the output pulse is increased, the response time of the active element is made slower. Thus, a high amplitude pulse current is obtained by sacrificing the response speed of the active element and of the modulator. Such a shortcoming has been partially overcome in the past by a pulse generator which includes a silicon controlled rectifier as the active element. This SCR type generator, which employs layered diodes, has come into wide use. Even such an SCR type generator, however, has a limited response or switching speed of up to 40 nanoseconds.

More recently, there has been an increasing demand for a generator with a faster response speed than that of the SCR type generator. Avalanche transistors have been recognized for sometime for their ability to switch at a high speed from a quiescent to active state, but have not been generally employed therefor, because of their relatively low power ratings.

SUMMARY OF THE INVENTION

It is the object of the present invention to provide an improved pulse generator which avoids the aforementioned shortcomings in the prior art pulse generators in general, and more particularly, to provide pulse generators which provide short duration high current pulses at a relatively high power rating.

In accordance with the present invention, the aforementioned objective is achieved with a generator having a pair of series connected avalanche transistors wherein each of the transistors are activated into their avalanche breakdown simultaneously and contribute their avalanche breakdown currents toward the total power of the output while maintaining their fast switching speeds. The generator includes a biasing means which normally maintains the avalanche transistors in their quiescent states and an input means for applying a triggering pulse to the transistors. The generator further includes a storage circuit having a capacitor in series with a transistor, and a diode means interposed between the storage circuit and the avalanche transistors. The diode means are so poled that the capacitor is charged while the avalanche transistors are in their quiescent states and is discharged into the avalanche transistors when the transistors are switched into an activated state by a triggering pulse.

It is a further feature of the present invention that any number of additional pairs of series connected avalanche transistors are provided in parallel with the first pair of avalanche transistors for further increasing the power output of the generator. A transformer having bifilar secondary windings may be connected to the two successive pairs of the avalanche transistors so that the avalanche breakdown of all of the transistors occur at substantially the same time and thus simultaneously apply their peaked pulse currents to a load.

DETAILED DESCRIPTION OF THE INVENTION

Figure 1:
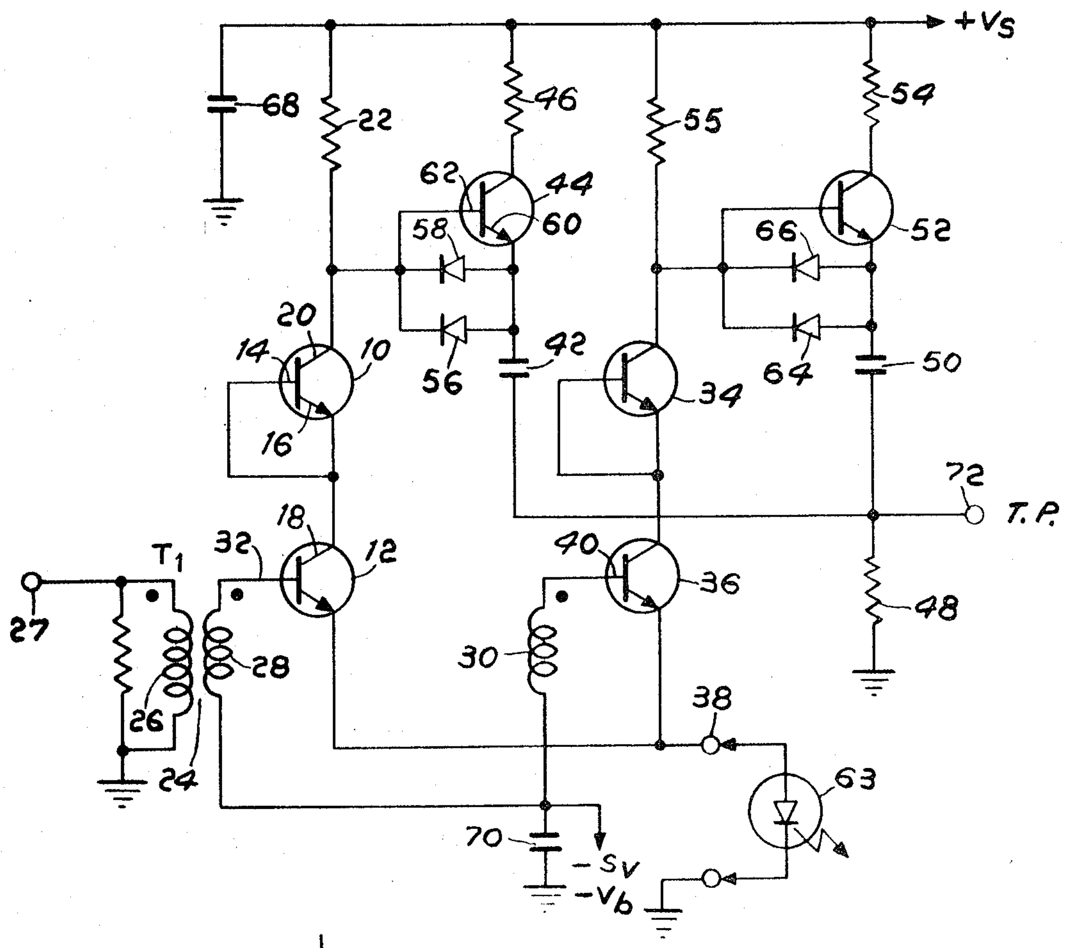
FIG. 1 shows a schematic circuit of the pulse generator in accordance with the present invention.

As shown in FIG. 1, the pulse modulator of the present invention utilizes a design concept which provides a unique interconnection for simultaneous triggering of series connected avalanche transistors. Thus, as shown, a first pair of avalanche transistors 10 and 12 are connected in series with each other. In the first pair of transistors the base electrode 14 of the first avalanche transistor 10 is strapped to the emitter electrode 16 thereof which is also connected to the collector electrode 18 of the second avalanche transistor 12. The collector electrode 20 of the first avalanche transistor is connected to a direct current source indicated as $+V_s$ via a resistive element 22. The resistor element 22 has a resistance of such a magnitude that essentially all of the positive potential $V_s$ drops thereacross and limits currents supplied therethrough to the avalanche transistors 10, 12 at a value less than that required to sustain the avalanche breakdown of the transistors. This assures that the transistors 10, 12 are not driven into their avalanche breakdown states by the potential $+V_s$. The base electrode of the second avalanche transistor 12 is negatively biased by a negative potential source $-V_b$ of a suitable small magnitude sufficient to prevent any extraneous or noise signal from overcoming the negative biasing of the base-to-emitter junction and thereby falsely initiating the avalanche breakdown.

The input means includes a transformer 24 whose primary winding 26 is connected to a trigger input terminal 27 which is coupled to an external trigger pulse source. The secondary of the transformer includes bifilar windings 28, 30, winding 28 being coupled to the negative bias source $-V_b$ and to the base electrode 32 of the second avalanche transistor 12 in the manner shown.

In the manner similar to the first pair of transistors, a second pair of transistors 34, 36 are connected between the source of potential $+V_s$ and the output terminals 38. The second winding 30 of the bifilar secondary windings of transformer 24 is connected between the negative bias $-V_b$ source and the base electrode 40 of transistor 36. The second transistor pair 34, 36 are in parallel relationship with the first transistor pairs 10, 12 so that the pulse generated by the second pair reinforces that generated by the first pair.

To enhance the avalanche breakdown process of the avalanche transistors 10, 12 a storage circuit including a capacitor 42, a transistor 44, and a resistive element 46 connected in series are provided, in the manner shown, between the direct current source $+V_s$ and ground through resistor 48. Similarly, a like set of elements capacitor 50, transistor 52 and resistor 54 are connected in series to enhance the breakdown process and he power output of transistors 34, 36.

A pair of diodes 56 and 58 are connected between the collector electrode of the first avalanche transistor 10 and the emitter electrode 60 of the transistor 44. The base electrode 62 of the transistor 44 is also connected to the collector electrode 20 of the first avalanche transistor 10. The diodes are poled so that while transistors 10, 12 are in quiescent states the current from source $+V_s$ is permitted to flow through the path including resistors 48, 22, 46 and transistor 44 to the capacitor 42 and charge it while preventing the current from the source $+V_s$ from flowing through the diodes to the avalanche transistors. In the present embodiment, a pair of diodes are shown to pole the junction voltage across the base and the emitter electrodes of the transistor 44. This is to provide an adequate safety factor in the power handling capacities of the diodes where one alone may not be enough. Should there be a diode having a sufficient power rating with a safety margin, it is preferable that one diode be used instead of a pair as shown.

The capacitor 42 charges and voltage thereacross reaches the magnitude of $+V_s$ while the avalanche transistors 10, 12 are in their quiescent states. When the avalanche transistors begin to undergo the avalanche breakdown in response to an applied input trigger pulse, the collector voltage of transistor 10 becomes lower as compared to that at emitter electrode 60 of the transistor 44. As a result, the diodes 56, 58 become forward biased and permit the stored charge in the capacitor 42 to discharge instantaneously via transistors 10, 12 and through diodes 56, 58, resistor 48 and load 63. This increases the amplitude of the output current pulse produced by the avalanche transistors and applied to the load 63.

In a similar manner, the second storage circuit including resistor 48, capacitor 50, transistor 52, resistors 54 and 55 operate in conjunction with the second pair of avalanche transistors 34, 36 in generating a high amplitude short duration pulse simultaneously with the first storage circuit and transistors 10, 12. The discharge path for the second storage circuit includes transistors 34, 36, diodes 64, 66, capacitor 50, resistor 48 and load 63.

The pulse generator includes capacitors 68 and 70 of suitable magnitudes connected between the direct current source $+V_s$ and $-V_b$ and ground, respectively, in a known manner, to filter out alternating current ripples from the output at the emitter electrodes of the avalanche breakdown transistors 12, 36 connected to the output terminals 38 of the generator. The output of the generator at the output terminals may be connected to a load 63 requiring a high speed and high amplitude pulse. A laser diode is a typical example of such a load.

While not essential to the working of the present invention, a test point 72 may be provided between storage capacitors 42 and 50 and a resistor 48 through which one side of the capacitors are grounded. The test point provides access to testing of the proper functioning of the storage circuits as well as the generator itself.

OPERATION OF THE GENERATOR

The generator described above in conjunction with FIG. 1 thus utilizes a design concept which provides a unique interconnection for simultaneous triggering of multiple avalanche transistors. Before describing the operation of the generator, a brief description of the mechanics of avalanche breakdown is in order for clearer understanding of the operation.

Figure 2:
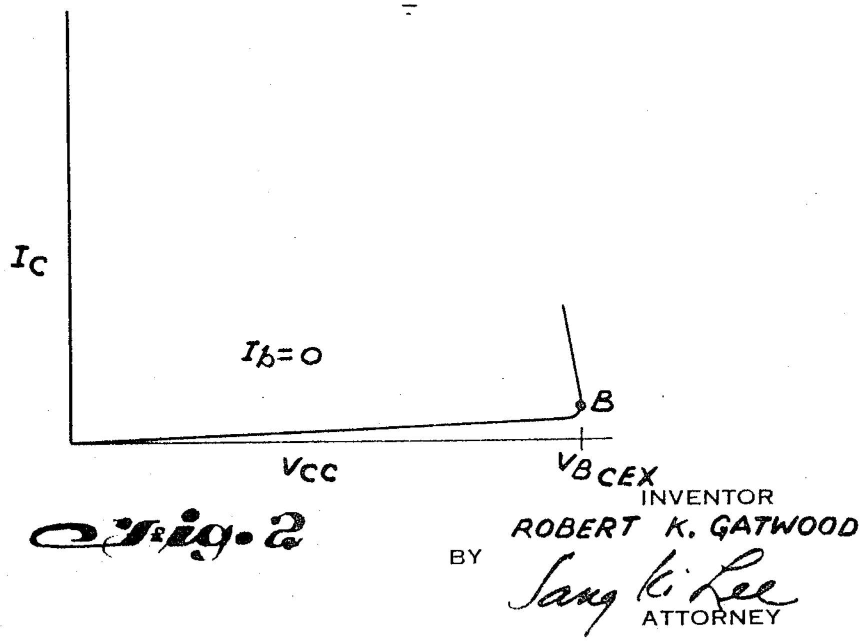
FIG. 2 shows the response characteristics of an avalanche transistor in terms of the avalanche breakdown voltage versus collector current.

Avalanche transistors are generally operated at collector voltages considerably above those of normal transistor operation. As shown in FIG. 2, if the base current, $I_b$, is maintained equal to zero, a small collector current $I_c$ flows as the collector voltage $V_{cc}$ is increased toward $VB_{CEX}$ the collector to emitter voltage required for breakdown. When the collector voltage exceeds $VB_{CEX}$, an avalanche multiplication and breakdown occurs and collector current increases very sharply. During the process of avalanche breakdown, the transistor exhibits a negative resistance characteristic similar to that of a four layer diode.

A reasonably stable operating point B can be established, however, if the maximum value of the collector current and voltage are suitably limited, by an external circuit resistance, to a value insufficient to result in avalanche multiplication. This is somewhat akin to Zener diode operation. The transistor continues to operate in its quiescent state until the value of $VB_{CEX}$ is effectively decreased by application of an external trigger. Once avalanche breakdown is permitted, the speed at which it occurs is not limited by carrier recombination times, as is the case in conventional transistor operation. Therefore, during the turn-on time an extremely high rate of change of current, *di/dt*, as great as $10^{10}$ amperes per second is possible.

Figure 3:
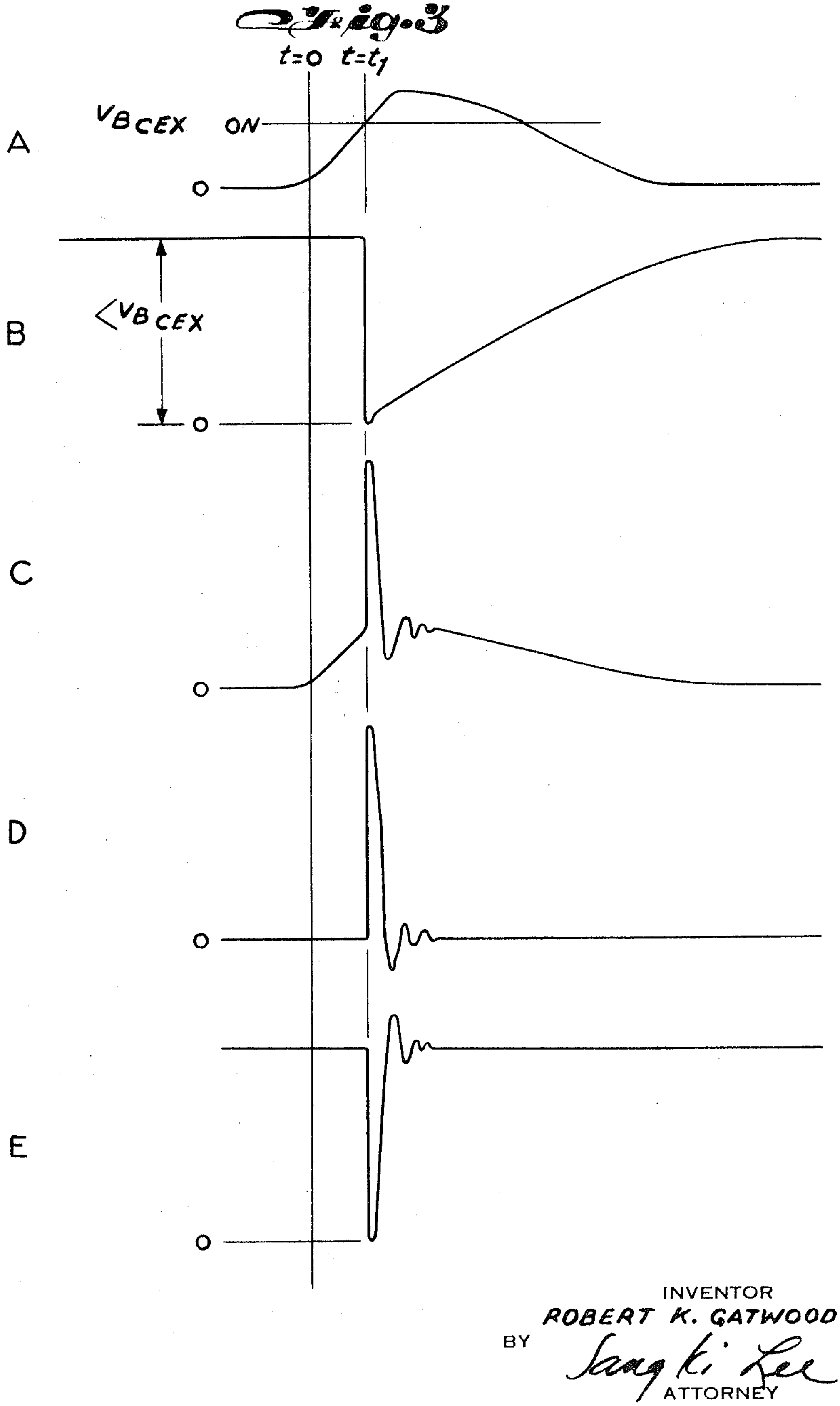
FIG. 3 shows the waveforms of the pulses at various positions of the pulse generator shown in FIG. 1 to illustrate operational characteristics of the generator.

Now turning to the operation of the present generator, the waveforms of FIG. 3 indicate the voltage levels versus time at various positions of the generator circuit of FIG. 1 in order to facilitate understanding of the circuit operation. Referring to FIG. 1, the quiescent operating current through the series connected transistors 10, 12 is limited by resistor 22 to a value less than that required to sustain avalanche multiplication. The total breakdown voltage for the series combination of the two transistors is approximately the sum of the two breakdown voltages. During the quiescent period the storage capacitor 42 is charged to a level to somewhat below this sum. The diodes 56, 58 are biased negatively during this time and prevent conduction therethrough. This condition remains until the avalanche breakdown takes place.

Referring to the waveforms, when a positive trigger pulse of suitable amplitude and rise time of the type shown by the waveform A is applied to the trigger input terminal 27, the bases of transistors 12 and 36 are driven positive at $t = t_1$. As this occurs, the collector-to-emitter voltage, $VB_{CEX}$, required to cause an avalanche breakdown decreases. This decrease in the value of $VB_{CEX}$, as shown by waveform B of FIG. 3, results in a partial discharge of capacitors 42, 50 through the series transistors 10, 12 and 34, 36 respectively. This, in turn, supplies additional currents to the transistors undergoing the avalanche multiplication and accelerates the avalanche breakdown. Moreover, importantly, simultaneous discharge of the stored charges from the capacitors 42, 50 contribute to and thereby increase the output power from the avalanche transistors without sacrificing their inherent high switching speeds. This is shown by the waveform C at the base electrode of the avalanche transistors 12 and 36 and the output waveform D at the output terminal 38 applied to load 63.

As the process continues, a large transient voltage is applied through the collector-base junction capacitance of the avalanche transistors 12 and 36 beginning to avalanche and the winding capacitance of the transformer windings 28 and 30 to the output load 63, such as a laser diode. This insures substantially simultaneous avalanching of the transistors 10, 12 and 34, 36 of the parallel networks, as capacitors 42 and 50 discharge abruptly through their corresponding transistors 12 and 36 into the laser diode. Capacitors 42 and 50 continue to so discharge until there is insufficient current flow to maintain the avalanche conditions.

The avalanche transistors are subsequently cut off and become quiescent again, and the voltage at the collectors of transistors 10, 12 returns to its original stable value of $VB_{CEX1}$ $+VB_{CEX2}$, until the next trigger pulse is applied.

During this process transistors 44 and 52 become forward-biased, charging capacitors 42 and 50, respectively, to a level again nearly equal to $VB_{CEX1} + VB_{CEX2}$, thus completing the cycle. Diode pairs 56, 58 and 64, 66 prevent capacitors 42 and 50 from loading the collectors of transistors 10 and 34 during the charging cycle.

By way of an example, various elements of the generator having the following specific parameters may be connected in the manner shown in FIG. 1:

| | |
|---|---|
| Input voltage pulse | + 6v peak |
| Output voltage pulse | + 40v peak |
| $+V_s$ | + 125v + 250v |
| $-V_b$ | − 5v |
| Resistors **22, 55** | each 430,000 ohms |
| Resistors **46, 54** | each 15,000 ohms |
| Avalanche transistors **10, 12** **34, 36** | each 2N2222A |
| Transistors **44, 52** | each 2N3439 |

The generator having the aforementioned parameters provided an output of up to 70 amperes at 40 volts with a pulse width of 20 nanoseconds at the one-half peak current point, and with a rise time of less than 10 nanoseconds. The speed of the generator was measured at the test point 72 connected to capacitors 42, 50 and grounded via the resistor 48. The waveform found at the test point 72 is shown in FIG. 3, E which is inverse of the waveform D at the load 63.

The recharge of the energy storage capacitors was rapid enough to permit pulse repetition rates up to 10,000 pulses per second without requiring periodic shut down intervals for cooling the avalanche transistors. There is nothing inherent in the generator circuit design which would preclude operation at a faster repetition rate. This favors the present generator over those previously available in that the operating efficiency and power dissipating characteristics of prior injection laser diode type generators will not permit operation at the aforementioned repetition rates without a cooling cycle.

The pulse generator with the specific values as described hereinabove are merely illustrations of the principles of the present invention. Various changes may be made without departing from the spirit and scope of the invention. Thus, for example, if necessary, any number of stages may be connected in parallel with the first and second stages described above, for further increasing the output of the pulse generator.

What is claimed is:

1. A pulse generator comprising:

first and second avalanche breakdown transistors connected in series, each transistor having collector, emitter and base electrodes, direct current supply means applying a potential across said series connected transistors for biasing said transistors into a quiescent state, the collector of said first transistor being connected to a predetermined potential, the emitter of said second transistor being connected to a reference point, the collector of said second transistor being connected to the base and emitter of said first transistor, input means connected to the base of said second transistor for applying a triggering signal to simultaneously switch said first and second transistors from said quiescent state into an active state to generate an output pulse, first storage means including resistive means, a transistor and a capacitor connected in series between said predetermined potential and reference point of said direct current supply means for storing an electric charge during said quiescent state, unidirectional conduction means connected between said storage means and said series transistors for discharging the stored charge into said series transistors in response to said triggering signal for increasing said output pulse, and load means connected in series with said avalanche transistors for utilizing said output pulse.

2. The generator in accordance with claim 1, wherein said first unidirectional conduction means is connected between said capacitor and said collector of said first avalanche transistor, said first unidirectional conduction means being poled such that it prevents discharge of said capacitor during said quiescent state of said first and second avalanche breakdown transistors and provides a discharge path for said capacitor to said first and second avalanche breakdown transistors when said first and second transistors are switched into activated states.

3. The pulse generator in accordance with claim 2, wherein the emitter electrode of said second avalanche transistor is connected to said load.

4. The pulse generator in accordance with claim 3, further including means for negatively biasing the base electrode of said second avalanche breakdown transistor for stabilizing the avalanche breakdown voltage of said avalanche transistors and for preventing false triggering of said avalanche transistors from noise transients.

5. The pulse generator in accordance with claim 4, further including a third and fourth avalanche transistors connected in series with each other and with said load means and in parallel with said first and second transistors and having quiescent and active states occurring simultaneously with said first and second transistors.

6. The pulse generator in accordance with claim 5, further including a second storage means including second resistive means, a further transistor and a second capacitor connected in series between said predetermined potential and reference point of said direct current supply means for storing an electric charge during said quiescent state of said third and fourth transistors and second unidirectional conduction means connected between said second storage means and said third and fourth transistors for discharging the stored charge into said third and fourth transistors in response to said triggering signal for increasing said input pulse.

7. The pulse generator in accordance with claim 6, wherein said second unidirectional conduction means is connected between said second capacitor and the collector of said third transistor and is poled such that it prevents discharge of said second capacitor during said quiescent state of said third and fourth transistors and provides a discharge path for said second capacitor to said third and fourth transistors when said third and fourth transistors are switched into active states.

8. The pulse generator in accordance with claim 7, wherein said third and fourth avalanche transistors include emitter, base and collector electrodes, the collector electrode of said third avalanche transistor being connected to said direct current supply means and to said second unidirectional conduction means, the emitter electrode of said third avalanche transistor being connected to the collector electrode of said fourth avalanche transistor and to the base of said third avalanche transistor, the base electrode of said fourth avalanche transistor being coupled to said input means, and the emitter electrode of said fourth transistor connected to said load means.

9. The pulse generator in accordance with claim 8, wherein said input means includes a transformer having a primary and bifilar secondary windings, said bifilar secondary windings being connected respectively and with the same signal polarity to the base electrodes of said second and fourth avalanche transistors.

10. The pulse generator in accordance with claim 9, wherein each of said unidirectional conduction means includes a pair of diodes in parallel.

11. The pulse generator in accordance with claim 6, including a further pair of series connected avalanche transistors connected in parallel with said third and fourth transistors and in series with said load means, and including further storage means and unidirectional discharge means connected respectively in the same manner as said second storage and unidirectional discharge means.

* * * * *